United States Patent

Buell

(10) Patent No.: US 10,132,842 B2
(45) Date of Patent: Nov. 20, 2018

(54) VIRTUAL GROUND SENSING CIRCUIT FOR HIGH IMPEDANCE VOLTAGE SENSORS

(71) Applicant: COOPER TECHNOLOGIES COMPANY, Houston, TX (US)

(72) Inventor: Richard Ralph Buell, South Milwaukee, WI (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

(21) Appl. No.: 15/058,619

(22) Filed: Mar. 2, 2016

(65) Prior Publication Data

US 2016/0291065 A1 Oct. 6, 2016

Related U.S. Application Data

(60) Provisional application No. 62/141,584, filed on Apr. 1, 2015.

(51) Int. Cl.
*G01R 19/00* (2006.01)
*G01R 15/06* (2006.01)

(52) U.S. Cl.
CPC ......... *G01R 19/0023* (2013.01); *G01R 15/06* (2013.01); *G01R 19/0084* (2013.01)

(58) Field of Classification Search
CPC ..... G01R 15/04–15/26; G01R 19/0023; G01R 19/0084
See application file for complete search history.

(56) References Cited

U.S. PATENT DOCUMENTS

| 4,091,432 A | * | 5/1978 | Muller | G05F 1/461 323/304 |
| 4,121,154 A | * | 10/1978 | Keating | G01R 1/30 324/126 |
| 4,241,373 A | * | 12/1980 | Mara | G01R 15/142 324/126 |

(Continued)

FOREIGN PATENT DOCUMENTS

GB 1 252 633 A 11/1971

OTHER PUBLICATIONS

European Patent Office, "International Search Report and Written Opinion" (Corresponding PCT/US2016/023659, dated Jun. 9, 2016, 12 pp.

*Primary Examiner* — Huy Q Phan
*Assistant Examiner* — David Frederiksen
(74) *Attorney, Agent, or Firm* — Eckert Seamans

(57) ABSTRACT

A voltage sensing circuit includes an amplifier having a first input and an amplifier output, the first input being coupled to a node comprising a virtual ground, and a first impedance element having an input structured to be coupled to the conductor and an output coupled to the first input of the amplifier through the node. The first impedance element is structured to cause a current signal having a current directly proportional to the voltage on the conductor and a substantially zero volt voltage to be provided to the first input of the amplifier through the node responsive to the voltage of the conductor being provided to the input of the first impedance element. The amplifier is structured to cause an output voltage that is directly proportional to the current of the current signal to be provided at the amplifier output.

13 Claims, 1 Drawing Sheet

(56) References Cited

U.S. PATENT DOCUMENTS

| | | | | |
|---|---|---|---|---|
| 4,370,616 A | * | 1/1983 | Williams | G01R 15/165 |
| | | | | 324/457 |
| 4,804,922 A | * | 2/1989 | Sometani | G01R 19/155 |
| | | | | 324/108 |
| 5,107,202 A | * | 4/1992 | Renda | G01R 15/22 |
| | | | | 324/126 |
| 5,250,893 A | | 10/1993 | Gambill et al. | |
| 5,256,878 A | * | 10/1993 | LeVert | G01T 1/24 |
| | | | | 250/370.04 |
| 5,930,745 A | * | 7/1999 | Swift | G01R 19/2509 |
| | | | | 327/100 |
| 6,118,270 A | * | 9/2000 | Singer | G01R 15/181 |
| | | | | 324/115 |
| 2004/0038578 A1 | * | 2/2004 | Weigel | H01R 13/5219 |
| | | | | 439/320 |
| 2008/0111560 A1 | | 5/2008 | Regier | |
| 2009/0027042 A1 | | 1/2009 | Yao | |
| 2014/0070887 A1 | * | 3/2014 | Lam | H03F 3/3069 |
| | | | | 330/261 |
| 2015/0042304 A1 | * | 2/2015 | Cornu | G01G 3/13 |
| | | | | 323/303 |

\* cited by examiner

VIRTUAL GROUND SENSING CIRCUIT FOR HIGH IMPEDANCE VOLTAGE SENSORS

CROSS-REFERENCE TO RELATED APPLICATION

This application claims priority under 35 U.S.C. § 119(e) to U.S. Provisional Patent Application Ser. No. 62/141,584, filed Apr. 1, 2015, entitled "VIRTUAL GROUND SENSING CIRCUIT FOR HIGH IMPEDANCE VOLTAGE SENSORS", which is herein incorporated by reference.

BACKGROUND

Field

The disclosed concept pertains generally to voltage sensing devices, and, more particularly, to a high impedance voltage sensing device for measuring voltages that employs a virtual ground sensing circuit.

Background Information

Measuring AC voltage at a remote location in, for example, a power distribution system, can result in significant errors, especially when a high impedance voltage sensor is used. In particular, when a cable is used to transport the signal, the capacitance of the cable can lead to erroneous measurements. If a shielded cable is used (which is often the case), then the capacitance of the signal wire to the shield and the high impedance sensor form a voltage divider that results in significant signal attenuation. In addition if the voltage sensor is resistive, then the capacitive reactance introduces a significant phase shift in the signal as well. If there are other conductors in the cable, then in addition to contributing to attenuation and phase shift, there will also be crosstalk. The attenuation, phase shift, and crosstalk are all a function of the cable capacitance, which increases with cable length and varies between cable types. Furthermore, wire to wire capacitance varies within a given multi-conductor cable because the distance between all the conductors in the cable varies. Consider, for example, that in a twenty-eight conductor circular cable, the center conductors are adjacent to each other such that the wire to wire capacitance will be relatively high, whereas the center to outer conductors are spaced further apart such that the wire to wire capacitance is lower. Moreover, an AC voltage difference between conductors will result in higher capacitive currents flowing between the conductors with higher capacitances. These unintentional capacitive currents produce measurement errors. A conductor that lies between two other conductors also tends to shield those conductors from each other. The situation is further complicated when the impedance to ground differs between conductors. That is to say, all the conductors in a given cable may not be connected to high impedance voltage sensors. Rather, in a multi-purpose cable, there are likely to be other power and signal wires that have a low AC impedance to ground. This will complicate the analysis and make it all but impossible to calculate and compensate for the measurement errors.

In addition to the negative effects of parasitic capacitances, signals from high impedance sensors are also sensitive to leakage currents due to moisture in connectors. In outdoor applications, connectors are often exposed to high humidity and changing temperatures that result in condensation in the connectors. Most connectors don't provide a gas tight seal over the life of the installation, and some are directly exposed to rain water and will eventually leak. In a high voltage (e.g., 38 kV) application, the voltage sensor is often a resistive divider consisting of a 200M ohm high voltage resistor connected to a 100 k ohm low arm resistor. To introduce a 1% error, moisture would only need to reduce the surface insulation resistance of the connector system to less than 10M ohms. In practice, this happens all too often. In a recent lab experiment, a connector was placed under water and the signal dropped to 2.5% of its original value.

Another source of error is from the voltage clamp devices that are often required on both sides of the cable. On the sensor side, a TVS (transient voltage suppressor), MOV (metal oxide varistor), or zener diode may be needed to prevent the voltage from rising too high in the event that the control cable is disconnected and the low arm resistor is not present. These devices all have parasitic capacitance that results in leakage current that attenuates the signal and introduces a phase shift. The capacitance will vary with temperature, and typically is not specified in the data sheets for the parts. On the other end of the cable, the sensing circuit will also contain one of these devices. In this case, the voltage clamp is for surge protection of sensitive electronic circuits.

Furthermore, when a low level signal is to be transported over some distance (e.g., 20 to 120 feet), the first thing a designer does to minimize error is specify a shielded cable. Another technique is to use twisted pairs. Still another approach would be to use individually shielded conductors or coaxial cable. All of these alternatives increase the capacitance and can make the situation worse.

SUMMARY

In one embodiment, a voltage sensing circuit for measuring a voltage on a conductor is provided. The voltage sensing circuit includes an amplifier having a first input and an amplifier output, the first input being coupled to a node comprising a virtual ground. The voltage sensing circuit also includes a first impedance element having an input structured to be coupled to the conductor and an output coupled to the first input of the amplifier through the node, wherein the first impedance element is structured to cause a current signal having a current directly proportional to the voltage on the conductor and a substantially zero volt voltage to be provided to the first input of the amplifier through the node responsive to the voltage of the conductor being provided to the input of the first impedance element, and wherein the amplifier is structured to cause an output voltage that is directly proportional to the current of the current signal to be provided at the amplifier output.

In another embodiment, a method of measuring a voltage is provided that includes receiving the voltage, creating a current signal having a current directly proportional to the voltage and a substantially zero volt voltage responsive to receiving the voltage, and creating an output voltage that is directly proportional to the current of the current signal, wherein the output voltage is used to measure the voltage.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
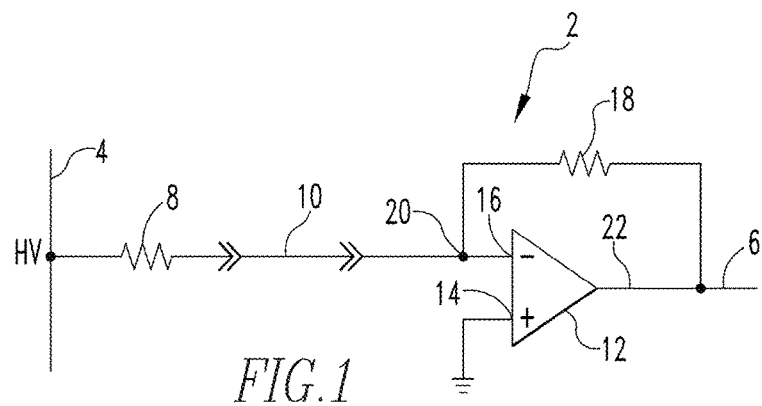
FIGS. 1, 2 and 3 are schematic circuit diagrams of voltage sensing circuits according to three exemplary embodiments of the disclosed concept.

Directional phrases used herein, such as, for example, left, right, front, back, top, bottom and derivatives thereof, relate to the orientation of the elements shown in the drawings and are not limiting upon the claims unless expressly recited therein.

As employed herein, the term "number" shall mean one or an integer greater than one (i.e., a plurality). As employed herein, the statement that two or more parts are "coupled" together shall mean that the parts are joined together either directly or joined through one or more intermediate parts.

As employed herein, the term "virtual ground" shall mean a node that is being held at ground potential by the actions of an active circuit without being directly connected to ground.

As employed herein, the term "substantially zero volts" shall mean a voltage level of 250 mV peak or less.

As employed herein, the term "high impedance" shall mean an impedance of 1 MΩ or greater.

As employed herein, the term "high voltage" shall mean voltage level of 1000 VAC or more.

As employed herein, the term "impedance element" shall mean one or more high impedance resistors, one or more capacitive elements, or any combination thereof.

FIG. 1 is a schematic circuit diagram of a voltage sensing circuit 2 according to an exemplary embodiment of the disclosed concept. In the exemplary embodiment, voltage sensing circuit 2 is used for sensing a high voltage (HV) on, for example, a high voltage conductor 4 (such as a high voltage busbar) of a power distribution system. Voltage sensing circuit 2 provides an output voltage 6 that may be provided to any of a number of circuits that could make use of the output voltage 6. For example, output voltage 6 may be provided to a microcontroller with an A/D converter, which would convert output voltage 6 into a digital format. Once output voltage 6 is represented in a digital format, it can simply be displayed or it could be used in some form of protection scheme.

As seen in FIG. 1, voltage sensing circuit 2 further includes a high arm resistor 8, a cable 10, an operational amplifier (op-amp) 12 having a non-inverting input 14 and inverting input 16, and a feedback resistor 18. High arm resistor 8 includes a first end coupled to high voltage conductor 4 and a second end coupled to an input end of cable 10. In the exemplary embodiment, high arm resistor is a high impedance resistor that has an impedance of at least 1 MΩ. An output end of cable 10 is coupled to inverting input 16 of op-amp 12 at a node 20. Non-inverting input 14 of op-amp 12 is directly connected to ground. Feedback resistor 18 includes a first end coupled to node 20 and a second end coupled to an output 22 of op-amp 12. Feedback resistor 18 forms a negative feedback loop for op-amp 12 which causes non-inverting input 14 and inverting input 16 to be at the same potential. Thus, because non-inverting input 14 is tied to ground, inverting input 16 will also be maintained at ground. As a result, node 20 forms a virtual ground for voltage sensing circuit 2. In one particular, non-limiting exemplary embodiment, high arm resistor 8 is a 200 MΩ resistor and feedback resistor is a 6.2 kΩ resistor.

In operation, a high voltage signal from high voltage conductor 4 is provided to high arm resistor 8. Since the second end of high arm resistor is coupled to the virtual ground of node 20, a low current signal (for example, on the order of 100 micro-amps) that is directly proportional to the voltage of the high voltage signal provided to high arm resistor 8 is produced on cable 10 (i.e., the high voltage signal is converted to a low current signal by high arm resistor 8). Because high arm resistor 8 is a high impedance resistor, the low current signal will have a voltage that is substantially zero volts. The low current, substantially zero volt signal from cable 10 is provided to inverting input 16 of op-amp 12. Op-amp 12 having the negative feedback loop as described above, in response to receiving the low current, substantially zero volt signal, will output the output voltage 6 on output 22 with the output voltage 6 having a measurable (not substantially zero volt) voltage that is directly proportional to the current of the low current, substantially zero volt signal provided to inverting input 16 (i.e., op-amp 12 converts the received low current signal into a voltage signal). Thus, voltage sensing circuit 2 as just described produces an output voltage 6 that is directly proportional to the voltage of the high voltage signal on high voltage conductor 4. In addition, since node 20 is maintained at ground and the signal transmitted on cable 10 is a substantially zero volt signal, virtually all capacitive and resistive leak currents, and the errors associated there with, will be eliminated from voltage sensing circuit 2.

One consequence of not having a series resistance at the inputs of op-amp 12 is that op-amp 12 is susceptible to surge damage. In a conventional voltage sensing circuit, the normal surge protection scheme is to place a voltage clamping device at the input connection to the board on which the voltage sensing circuit is provided and utilize the series resistor that follows to limit the current to some very small manageable value. The normal clamp voltage is set high enough so it will not interfere with the highest signal level of interest. However, since the input resistance in the voltage sensing circuit 2 of the disclosed concept is zero, any voltage surge that exceeds the power supply rails of op-amp 12 by more than a diode drop will cause the internal protection diodes of op-amp 12 to handle the surge. These diodes are not very robust and will not hold up in high surge current applications like those that involve lightening discharges.

Figure 2:
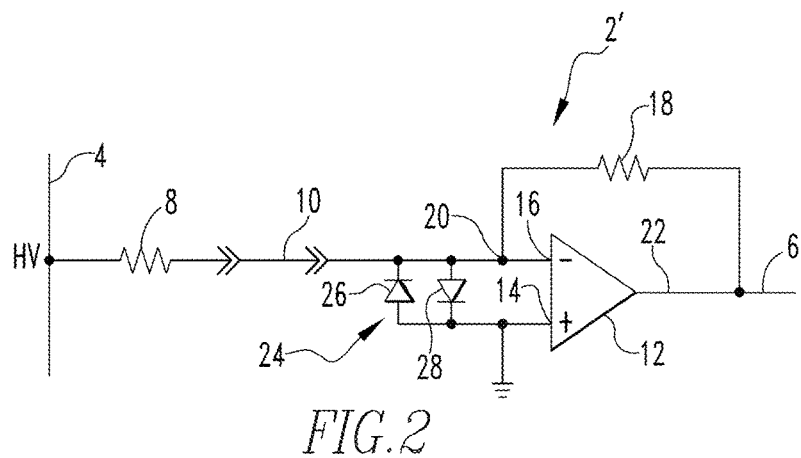

Thus, according to a further aspect of the disclosed concept, an alternative voltage sensing circuit 2' shown in FIG. 2 is provided according to an alternative exemplary embodiment that addresses these issues. As seen in FIG. 2, alternative voltage sensing circuit 2' includes many of the same components as voltage sensing circuit 2, and like components are labeled with like reference numerals. However, voltage sensing circuit 2' further includes a surge protection module 24 provided between inverting input 16 of op-amp 12 and surge ground. In the exemplary embodiment, surge protection module 24 includes large junction diodes 26, 28 connected in an anti-parallel configuration to the surge ground. This will clamp surges of either polarity to within a forward diode drop of ground and will prevent the protection diodes of op-amp 12 from conducting. In one non-limiting, exemplary embodiment, each large junction diode 26, 28 may be a TVS (Transient Voltage Suppressor) with a 5 W steady state power rating and a 1500 W peak power rating. The surge protection diodes will not interfere with normal operation because during normal operation the input voltage is held to zero and as such no current will flow through the surge protection diodes. During a surge event however, the op-amp circuit is not capable of maintaining an input voltage of zero due to speed and output voltage limitations of the op-amp.

Figure 3:
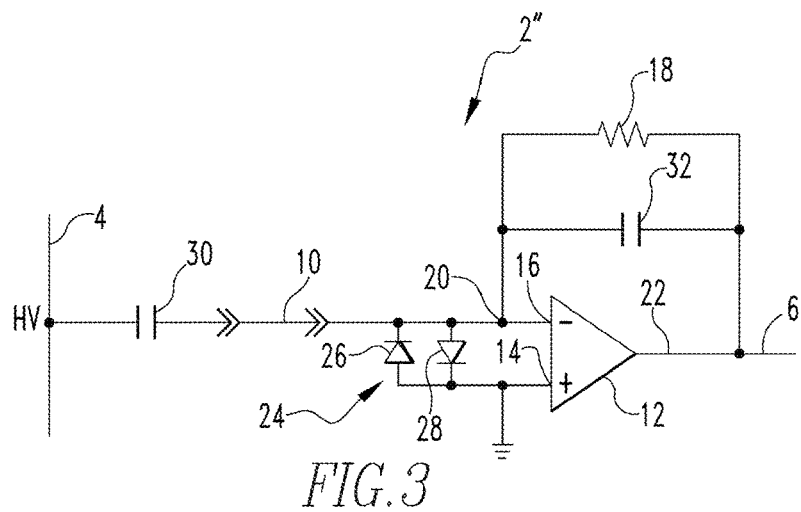

Furthermore, the concept disclosed herein may also be used in connection with capacitive sensors. Thus, according to a further aspect of the disclosed concept, a voltage sensing circuit 2" shown in FIG. 3 is also provided. Voltage sensing circuit 2" is similar to voltage sensing circuits 2 and 2', and like components are labeled with like reference numerals. However, in voltage sensing circuit 2", high arm resistor 8 is replaced with a capacitor element 30 and a capacitor element 32 is added in parallel with feedback resistor 18.

Alternatively, voltage sensing circuit 2" may use feedback resistor 18 alone to form the feedback loop thereof. Operation of Voltage sensing circuit 2" is similar to operation of voltage sensing circuits 2 and 2', with a low current, substantially zero volt signal being provided to inverting input 16 of op-amp 12 and output voltage 6 that is directly proportional to the voltage of the high voltage signal on high voltage conductor 4 being created at output 22 of op-amp 12. In this embodiment, since the capacitive current from the sensor is proportional to the frequency, frequency compensation is required. This could be done via an analog or digital filter in a following stage. One advantage of using capacitor element 32 in the feedback circuit is that it automatically provides frequency compensation.

In the embodiment of FIG. 3, capacitor element 30 could be a stand-alone component with one terminal that physically connects to high voltage conductor 4 and the other terminal that connects to cable 10. The capacitor element 30 could also be comprised of two or more parts that when placed in close proximity to each other form a capacitor, since a is simply two conductive surfaces separated by an insulator. One of the conductive surfaces could be a copper rod that was already part of a piece of switchgear. Simply adding a conductive ring that is held a fixed distance from the copper rod creates a capacitor that could be used as capacitor element 30. There could also be several components that make up capacitor element 30.

While the exemplary embodiments of voltage sensing circuits 2, 2' and 2" shown in FIGS. 1-3 each employ an amplifier in the form of op-amp 12, it will be understood that the amplifier may take other forms within the scope of the disclosed concept. For example, the amplifier could be built using discrete components such as transistors, resistors, diodes, and capacitors. Alternatively, vacuum tube technology could be used to build the amplifier as well. A combination of integrated and discrete components can be used to form an amplifier that could be used to implement the disclosed concept.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A high voltage electrical system, comprising:
a high voltage conductor of a power distribution system; and
a high voltage sensing circuit coupled to the high voltage conductor for measuring a high voltage on the high voltage conductor, the high voltage sensing circuit including:
an amplifier having a first input and an amplifier output, the first input being coupled to a node comprising a virtual ground;
a cable having a cable capacitance associated therewith, wherein the cable has an input end and an output end, wherein the output end of the cable is coupled to the first input of the amplifier through the node and not through an impedance element; and
a sensor element including a first impedance element, the first impedance element having: (i) a first end coupled to the high voltage conductor for receiving the high voltage from the high voltage conductor, and (ii) a second end coupled to the input end of the cable, wherein the first impedance element is structured to cause a current signal having a current directly proportional to the high voltage on the high voltage conductor and a substantially zero volt voltage to be provided to the cable for transmission to the first input of the amplifier through the node responsive to the high voltage of the high voltage conductor being received by the first end of the first impedance element, and wherein the amplifier is structured to cause an output voltage that is directly proportional to the current of the current signal to be provided at the amplifier output.

2. The voltage sensing system according to claim 1, wherein the amplifier is an operational amplifier, wherein the first input is an inverting input, wherein the amplifier includes a second input that is a non-inverting input, wherein the second input is directly connected to ground, and wherein the voltage sensing circuit further includes a feedback impedance element provided between the amplifier output and the node.

3. The voltage sensing system according to claim 2, wherein the first impedance element comprises a high impedance resistor and the feedback impedance element comprises a feedback resistor.

4. The voltage sensing system according to claim 2, further comprising a surge protection module provided between the inverting input and surge ground.

5. The voltage sensing system according to claim 4, wherein the surge protection module comprises a first large junction diode and a second large junction diode connected in an anti-parallel configuration.

6. The voltage sensing system according to claim 1, wherein the first impedance element comprises a capacitor element and the feedback impedance element comprises a feedback capacitor, a feedback resistor, or a combination of a feedback resistor and a feedback capacitor.

7. The voltage sensing system according to claim 1, further comprising first and second connectors at opposites ends of the cable, wherein the first and second connectors are structured to cause leakage currents in the voltage sensing system in response to moisture in the first and second connectors.

8. A method of measuring a voltage of a high voltage electrical system, comprising:
receiving a high voltage at an input side of a sensor element including a first impedance element from a high voltage conductor of a power distribution system;
creating a current signal using the first impedance element, the current signal having: (i) a current directly proportional to the high voltage received from the high voltage conductor, and (ii) a substantially zero volt voltage;
providing the current signal to an input end of a cable having a cable capacitance associated therewith, wherein the cable has an output end that is coupled to a first input of an amplifier through a node and not through an impedance element, wherein the node comprises a virtual ground; and
creating an output voltage using the amplifier, wherein the output voltage is directly proportional to the current of the current signal, and wherein the output voltage is used to measure the voltage.

9. The method according to claim 8, wherein the first impedance element comprises a high impedance resistor.

10. The method according to claim 8, wherein the first impedance element comprises a capacitor element.

11. The method according to claim 8, further comprising creating the virtual ground using a negative feedback circuit provided between the node and an output of the amplifier.

12. The method according to claim 11, wherein the amplifier is an operational amplifier.

13. The method according to claim 8, wherein first and second connectors are provided at opposites ends of the cable, wherein the first and second connectors are structured to cause leakage currents to occur in response to moisture in the first and second connectors.

* * * * *